(12) United States Patent
Takada et al.

(10) Patent No.: US 6,284,353 B1
(45) Date of Patent: Sep. 4, 2001

(54) PRINTED WIRING BOARD AND METHOD OF MANUFACTURING THE SAME

(75) Inventors: Masaru Takada; Hiroyuki Kobayashi; Kenji Chihara; Hisashi Minoura; Kiyotaka Tsukada; Mitsuhiro Kondo, all of Ogaki (JP)

(73) Assignee: Ibiden Co., Ltd. (JP)

( * ) Notice: Subject to any disclaimer, the term of this patent is extended or adjusted under 35 U.S.C. 154(b) by 0 days.

(21) Appl. No.: 09/348,935

(22) Filed: Jul. 7, 1999

(30) Foreign Application Priority Data

| Jan. 10, 1997 | (JP) | 9-014635 |
| Feb. 19, 1997 | (JP) | 9-052481 |
| Feb. 28, 1997 | (JP) | 9-062131 |
| Mar. 3, 1997 | (JP) | 9-065509 |
| Dec. 9, 1997 | (JP) | 9-361961 |

(51) Int. Cl.$^7$ ................................................ B32B 3/00
(52) U.S. Cl. .................. 428/209; 428/901; 174/255; 174/261; 257/779; 257/780
(58) Field of Search ..................... 257/779, 780; 428/209, 901; 174/261, 255

(56) References Cited

U.S. PATENT DOCUMENTS

| 5,291,062 | * | 3/1994 | Higgins, III | 257/698 |
| 5,367,435 | * | 11/1994 | Andros et al. | 361/749 |
| 5,764,485 | * | 6/1998 | Lebaschi | 361/774 |
| 5,879,787 | * | 3/1999 | Petefish | 428/209 |
| 6,037,044 | * | 3/2000 | Giri et al. | 428/209 |

FOREIGN PATENT DOCUMENTS

| 02265294A | 10/1990 | (JP) . |
| 04162589 | 6/1992 | (JP) . |
| 06326438 | 11/1994 | (JP) . |
| 07007264A | 1/1995 | (JP) . |
| 08279678A | 10/1996 | (JP) . |
| 09130038A | 5/1997 | (JP) . |
| 10117067 | 5/1998 | (JP) . |

OTHER PUBLICATIONS

Publication: The 9th National Convention Record JIPC, Mar., 1995, Tokyo.

* cited by examiner

Primary Examiner—Cathy Lam
(74) Attorney, Agent, or Firm—Welsh & Katz, Ltd.; Thomas W. Tolpin

(57) ABSTRACT

A solder resist comprising a thermosetting resin is printed on a surface of an insulating board (7) having a conductor circuit (6). The solder resist is then heat-cured to form an insulating film (1) having a low thermal expansion coefficient. A laser beam (2) is then applied to the portion of the insulating film in which an opening is to be formed, to burn off the same portion for forming an opening (10), whereby the conductor circuit (6) is exposed. This opening may be formed as a hole for conduction by forming a metal plating film on an inner surface thereof. It is preferable that an external connecting pad be formed so as to cover the opening. The film of coating of a metal is formed by using an electric plating lead, which is preferably cut off by a laser beam after the electric plating has finished.

4 Claims, 15 Drawing Sheets

FIG. 1
(a)
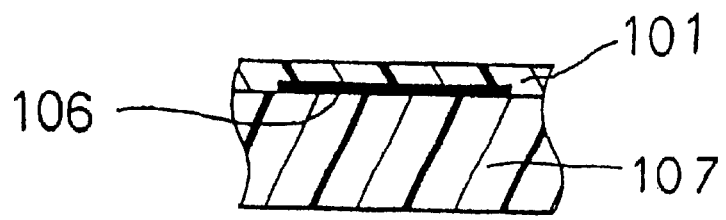
(b)
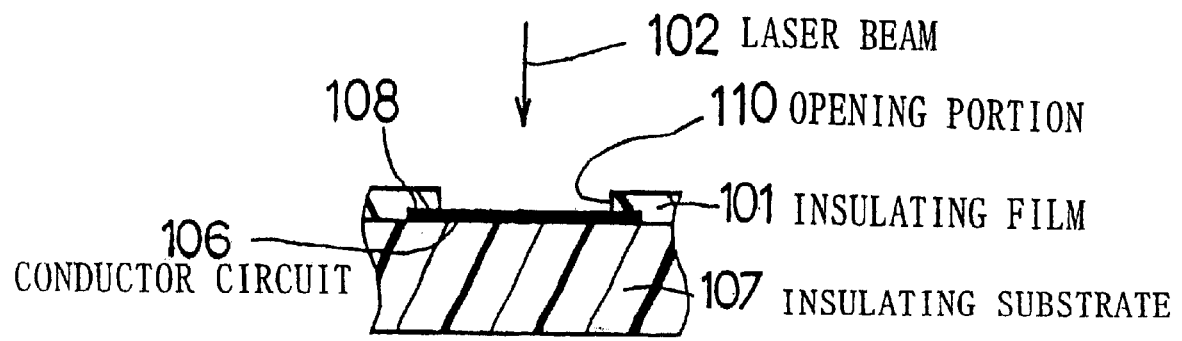

FIG. 2
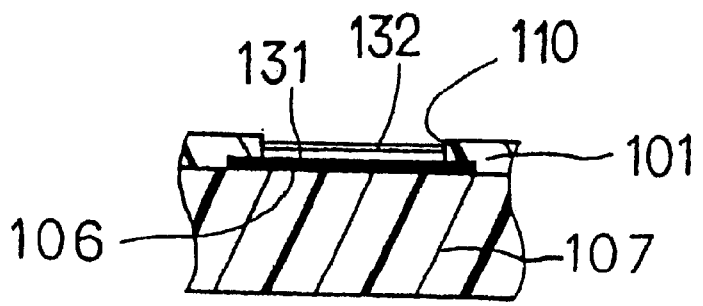
FIG. 3
(a)
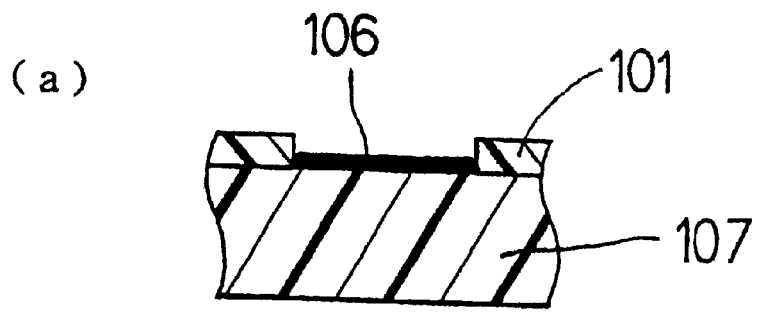
(b)
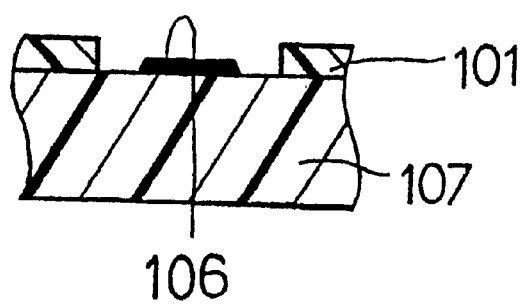

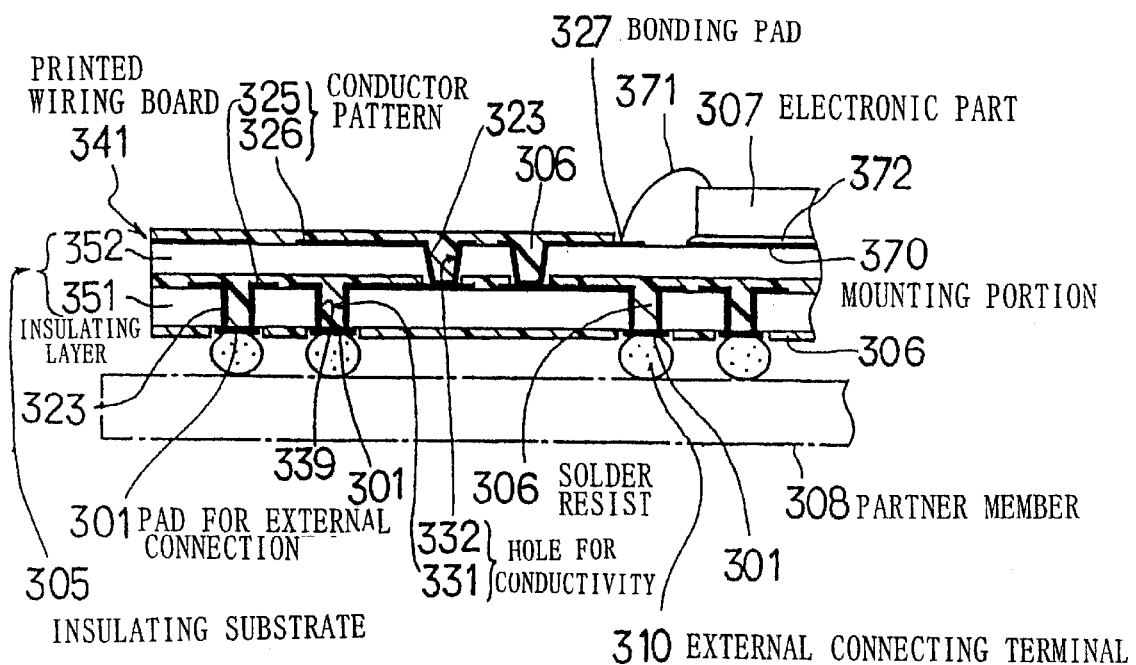
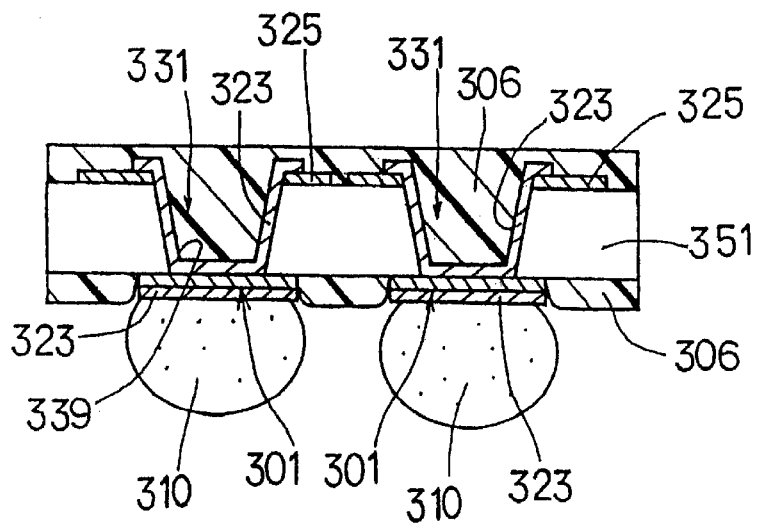

PRINTED WIRING BOARD AND METHOD OF MANUFACTURING THE SAME

TECHNICAL FIELD

The present invention relates to a printed wiring board and its manufacturing method, and particularly relates to a printed wiring board capable of forming a very small opening portion and a hole for conductivity and be mounted at high density, an electric conducting method between upper and lower faces of an insulating substrate, electric connection of a pad for external connection and the hole for conductivity, and a plating lead used in electric plating.

BACKGROUND ART

As shown in FIGS. 28 and 29, conventionally there is a printed wiring board having a mounting portion 970 for mounting electronic parts to an insulating substrate 97 and a conductor circuit 96 arranged around this mounting portion 970. A bonding pad portion 969 forming an end tip of the conductor circuit 96 is formed near the mounting portion 970. A pad portion 961 for joining a soldering ball, etc. is formed in the conductor circuit 96.

The mounting portion 970 is constructed by a concave portion surrounded by a mounting hole 971 formed in the insulating substrate 97 and a heat radiating plate 98 covering one end of the mounting hole 971.

As shown in FIG. 29, a surface of the insulating substrate 97 is covered with an insulating film 91 except for the pad portion 961 and the bonding pad portion 969. In other words, this insulating film 91 exposes the pad portion 961 and the bonding pad portion 969 by arranging an opening portion 910 above the pad portion 961 and the bonding pad portion 969.

A manufacturing method of the above printed wiring board will be explained next.

First, as shown in FIG. 30, a mounting hole 971 is bored in an insulating substrate 97 which is sticking a copper foil thereto. Next, the copper foil is etched so that a conductor circuit 96 having a pad portion 961 and a bonding pad portion 969 is formed.

Next, as shown in FIG. 28, solder resist constructed by thermosetting resin is printed on a surface of the insulating substrate 97. At this time, surfaces of the above pad portion 961 and the bonding pad portion 962 are exposed as they are without the solder resist printing.

Next, the solder resist is thermally cured and is set to an insulating film 91.

Thereafter, a heat radiating plate 98 is adhered to the surface of the insulating substrate 97 by using an adhesive 981 so as to cover one end of the mounting hole 971.

Thus, a printed wiring board 9 is obtained.

However, the above conventional manufacturing method of the printed wiring board 9 has the following problems.

Specifically, as shown in FIG. 31, except for a portion of the pad portion 961 no very small opening portion 910 can be formed in the insulating film 91 in a method for partially printing the above solder resist. Therefore, it is impossible only to expose a very small portion in the conductor circuit 96. As a result, no high density mounting can be improved.

In contrast to this, a manufacturing method as shown in FIG. 32 is proposed. In this method, an entire surface of the insulating substrate 97 forming the conductor circuit 96 therein is covered with a solder resist 912 constructed by an optical curing type resin. The solder resist 912 is exposed in a state in which a light interrupting mask 94 is arranged above an opening portion forming portion.

In this method, the solder resist 912 in a portion of light 940 interrupted by the mask 94 is not cured and is left as it is. In this state, the solder resist in an exposed portion is cured and forms an insulating film. Next, the insulating substrate 97 is dipped into a developing liquid and the solder resist in an uncured portion is removed from the insulating substrate 97. Thus, an opening portion 910 is formed in the cured insulating film 91 and one portion of the conductor circuit 96 is exposed.

However, in this method, since the optical curing type resin used as the solder resist has a property of absorbing humidity, no solder resist is suitable as the insulating film.

Further, since the above light has scattering light, the above light cannot be sufficiently interrupted so that no opening portion 910 can be formed in a sharp state. Therefore, for example, it is almost impossible to form a very small opening portion having a size equal to or smaller than 0.60 mm. Therefore, no high density mounting can be improved.

By using a drill there is also the method for boring a hole for conductivity. However, in this case, it is also difficult to form a very small hole for conductivity.

Further, there is a case in which various kinds of conductive members are formed around the hole for conductivity. Tangibly, such conductive members are constructed by a land surrounding a peripheral portion of the hole for conductivity, a pad for externally joining a soldering ball, a plating lead for forming electric plating, etc. High density is also desirable when these conductive members are formed.

With consideration to such conventional problems, the present invention provides a printed wiring board able to form an insulating film having a very small opening portion and be mounted at high density, and a manufacturing method of the printed wiring board.

DISCLOSURE OF THE INVENTION

A first invention is a manufacturing method of a printed wiring board characterized in that a conductor circuit is formed on the surface of an insulating substrate;

a solder resist made of thermosetting resin is next printed on the surface of said insulating substrate;

an insulating film having a coefficient thermal expansion equal to or smaller than 100 ppm/° C. is next formed by thermally curing the solder resist; and the conductor circuit is next exposed by irradiating a laser beam to an opening portion forming portion in the insulating film and burning-out the insulating film of said opening portion forming portion and forming an opening portion.

An operation and effects of the first invention will be explained.

In the first invention, the entire surface of the insulating substrate is covered with the insulating film and the laser beam is irradiated to a portion for forming the opening portion. High energy is given by a laser to the irradiating portion of the laser beam so that this irradiating portion has a very high temperature and is burnt out. Therefore, a very small opening portion can be formed in the insulating film.

Further, no light is scattered since the laser beam is parallel light. Therefore, a very small opening portion having an approximately size from 0.05 to 0.60 mm can be formed in desirable position and size. Accordingly, many opening portions can be formed in a small space so that high density mounting can be realized.

Thermosetting resin used in the solder resist has a low coefficient thermal expansion equal to or smaller than 100 ppm/° C. Therefore, the thermosetting resin has a property in which generation of stress of the solder resist is reduced by a temperature cycle test, etc. Accordingly, a close attaching property of the solder resist and the conductor circuit is improved.

In contrast to this, when the coefficient thermal expansion exceeds 100 ppm/° C., a problem exists in that the stress of the solder resist is increased by the temperature cycle test, etc.

A lower limit of the coefficient thermal expansion of the thermosetting resin includes 0 ppm/° C., but is preferably set to 1 ppm/° C. to more effectively show the above effects of the present invention.

The coefficient thermal expansion of the thermosetting resin used in the solder resist is preferably further set to range from 30 to 50 ppm/° C.

The above solder resist is preferably constructed by epoxy resin, triazine resin, polyimide resin, or a modified material thereof. In this case, a heat resisting close attaching property is improved between the solder resist and the conductor circuit. Further, an insulating substrate having a low water absorbing ratio is obtained through thermal curing of the solder resist.

A metallic plating film is preferably formed on a surface of the exposed conductor circuit after the laser beam is irradiated to the opening portion forming portion in the above insulating film. In this case, a solder leaking property on the conductor circuit surface is improved. Further, corrosion of the conductor circuit can be prevented.

Desmear processing is preferably performed on the surface of the exposed conductor circuit after the irradiation of said laser beam. The desmear processing is the processing for dissolving and removing the residue of the solder resist left on the surface of the exposed conductor circuit by a drug. In this case, the surface of the exposed conductor circuit is washed so that adhesive strength of the metallic plating film is improved. For example, the drug for the desmear processing is constructed by concentrated sulfuric acid, chromic acid, both of these mixed acid, or an acid obtained by adding sodium permanganate and potassium permanganate to each of these acids.

When the desmear processing is performed, there is a case in which the insulating film is separated from the insulating substrate on an interface with this insulating substrate at a peripheral edge of the opening portion in accordance with a kind of the solder resist forming the insulating film. Therefore, when the desmear processing is performed, the above solder resist is preferably constructed by thermosetting resin. The thermosetting resin has a resisting property with respect to a strong acid used in the desmear processing. Therefore, the separation of the insulating film at the peripheral edge of the opening portion can be prevented by using the thermosetting resin as the solder resist. For example, this thermosetting resin is constructed by epoxy resin, polyimide resin, triazine resin, etc.

A second invention is a printed wiring board characterized in that an upper face pattern is formed on an upper face of an insulating substrate and a lower face pattern is formed on a lower face of said insulating substrate and a hole for conductivity extends through said insulating substrate and reaches an upper face of said lower face pattern, and a metallic filling material filled with a metal for electrically conducting said upper face pattern and said lower face pattern is arranged within the hole for conductivity; and said upper face pattern has a width from 0.05 to 0.2 mm around said hole for conductivity.

In the second invention, it is most noticeable that the metallic filling material for electrically conducting the upper face pattern and the lower face pattern is arranged within the hole for conductivity.

An operation and effects of the second invention will be explained.

The hole for conductivity extends through the insulating substrate and a lower end portion of the hole for conductivity is closed by the lower face pattern. In contrast to this, the upper face pattern is arranged around an upper end portion of the hole for conductivity. Therefore, the upper face pattern and the lower face pattern can be electrically conducted to each other through the metallic filling material by forming the metallic filling material within the hole for conductivity.

The metallic filling material within the hole for conductivity is joined to the upper face pattern at least on a side face of an upper end portion of the metallic filling material. Therefore, the upper face pattern can be joined to the metallic filling material irrespective of the large or small value of a width of the upper face pattern, and the upper face pattern and the hole for conductivity can be electrically conducted reliably.

Therefore, it is not necessary that the width of a plating attaching area for forming a plating film in the hole for conductivity is formed in the upper face pattern as in the conventional case. Consequently, in accordance with the present invention, the width of the upper face pattern arranged around the hole for conductivity can be reduced to a width of 0.05 to 0.2 mm. Further, a surplus area is formed on a surface of the insulating substrate by the reduction in the width of the upper face pattern. Accordingly, another upper face pattern, an electronic part mounting portion, etc. can be further formed in this surplus area so that high density mounting can be achieved.

The second invention can also be applied to a multilayer printed wiring board having two or more insulating substrates laminated to each other as well as the printed wiring board constructed by a single insulating substrate. In the case of the multilayer printed wiring board, the hole for conductivity for electrically conducting the upper face pattern and the lower face pattern can be arranged such that this hole for conductivity extends through each insulating substrate. Further, this hole for conductivity can also be arranged such that this hole continuously extends through plural insulating substrates. In the multilayer printed wiring board, there is a case in which the upper face pattern or the lower face pattern is set to an inner layer pattern and is also set to an outer layer pattern.

The above metallic filling material is preferably constructed by solder. In this case, the interior of the hole for conductivity is easily filled with the solder since the solder is melted at a low temperature. Further, the joining can be performed at low cost since the soldering material is cheap.

The above metallic filling material is preferably constructed by a plating deposit material in which a plating layer is deposited on the above lower face pattern within the above hole for conductivity. In the plating deposit material, the metallic filling material is formed within the hole for conductivity by sequentially depositing a metal from an upper face of the lower face pattern within the hole for conductivity and/or a wall face of the hole for conductivity. Thus, the metallic filling material can be easily formed within the hole for conductivity.

In particular, the plating deposit material is preferably formed by using an electric plating method. This is because the metallic filling material can be rapidly formed since the depositing speed of a metal in the electric plating method is higher than that in a chemical plating method. In particular, the electric plating method is preferably used when the insulating substrate is thin in thickness and the hole for conductivity is shallow in depth. This is because the metallic filling material can be rapidly formed since a depositing thickness from the upper face of the lower face pattern may be set to be thin.

The above upper face pattern is preferably covered with a resist film except for a peripheral portion of the above hole for conductivity. In this case, the interior of the hole for conductivity can be filled with the metal without attaching the metal for forming the metallic filling material to the upper face pattern near the peripheral portion of the hole for conductivity.

As a method for manufacturing the printed wiring board as the second invention, there is a manufacturing method of a printed wiring board characterized by an upper face pattern formed on an upper face of an insulating substrate around a forming portion of a hole for conductivity so as to surround this forming portion of the hole for conductivity, and a lower face pattern is formed on a lower face of said insulating substrate so as to cover said forming portion of the hole for conductivity; the hole for conductivity extending through said insulating substrate and reaching an upper face of said lower face pattern is next formed in the forming portion of the hole for conductivity in said insulating substrate; and a metallic filling material is next formed by filling the interior of said hole for conductivity with a metal so that said upper face pattern and said lower face pattern are electrically conducted to each other through the metallic filling material.

In this manufacturing method, after the upper face pattern and the lower face pattern are formed in the insulating substrate, the metallic filling material is formed within the hole for conductivity in a state in which the hole for conductivity is set to a non-through hole by covering a lower end of the hole for conductivity with the lower face pattern. Therefore, the upper face pattern and the lower face pattern can be conducted to each other electrically through the metallic filling material.

Further, since the electric conduction is performed by the metallic filling material formed within the hole for conductivity, it is not necessary that the width of a plating attaching area for forming a plating film in the hole for conductivity is formed in the upper face pattern. Accordingly, the width of the upper face pattern arranged around the hole for conductivity can be reduced in comparison with the conventional case. Therefore, an upper face pattern, an electronic part mounting portion, etc. can be formed by the reduction in the width of the upper face pattern so that high density mounting can be achieved.

When the above hole for conductivity is formed, a laser beam is preferably irradiated to the forming portion of the hole for conductivity in the insulating substrate. In this case, the hole for conductivity as a non-through hole can be easily formed in the forming portion of the hole for conductivity.

In particular, the hole for conductivity having a small diameter can be accurately formed since the laser beam can bore the hole locally.

Before the interior of the above hole for conductivity is filled with the metal, the upper face of the above insulating substrate is preferably covered with a resist film except for the above hole for conductivity. In this case, when the interior of the hole for conductivity is filled with the metal, no upper face pattern is stained by attaching the metal to this upper race pattern, etc.

The metal filling the interior of the above hole for conductivity is constructed preferably by solder. It is also preferable to fill the interior of the above hole with the metal by depositing a plating layer on the upper face of the above lower face pattern within the above hole for conductivity. In these cases, as mentioned above, the interior of the hole for conductivity can be easily filled with the metal.

The second invention can be utilized in a multilayer printed wiring board requiring high connection reliability such as a memory module, a multichip module, a mother board, a daughter board, a plastic package, etc.

A third invention is a printed wiring board having an insulating substrate constructed by one, two or more insulating layers, a pad for external connection arranged in an outermost layer of the insulating substrate, a conductor pattern arranged in another layer different from said outermost layer, and a hole for conductivity for electrically connecting said pad for external connection and said conductor pattern; the printed wiring board characterized with said pad for external connection closing an opening portion of the hole for conductivity on its outermost layer side forming a bottom portion of the hole for conductivity, and a metallic plating film for continuously covering an inner wall and the bottom portion of the hole for conductivity is formed within said hole for conductivity.

An operation and effects of the third invention will be explained.

The pad for external connection is arranged so as to form the bottom portion of the hole for conductivity. Therefore, it is not necessary to form a conductor pattern for connecting the hole for conductivity and the pad for external connection. Accordingly, a surplus area is formed on a surface of the insulating substrate and another conductor pattern, etc. can be further formed in this surplus area so that high density surface mounting can be obtained. Further, the distance between respective holes for conductivity can be reduced so that the holes for conductivity can be formed at high density.

The pad for external connection closes the opening portion of the hole for conductivity on its outermost layer side and forms the bottom portion of the hole for conductivity. Therefore, the pad for external connection has at least one area of the opening portion of the hole for conductivity. Hence, the pad for external connection can secure a sufficient joining area for joining an external connecting terminal and has an excellent joining strength to the external connecting terminal.

The metallic plating film for continuously covering the inner wall and the bottom portion of the hole for conductivity is arranged within the hole for conductivity. Therefore, the bottom portion of the pad for external connection is strongly joined to the metallic plating film so that joining strength to the hole for conductivity is improved. Hence, for conductivity the pad for external connection can be reduced to a size close to that of the opening portion of the hole.

Accordingly, it is possible to realize high density mounting of the pad for external connection and increase density of surface mounting of the insulating substrate.

For example, the above conductor pattern is all conductive patterns which are able to be formed on the surface of the insulating substrate such as a wiring circuit, a pad, a terminal, a land, etc. For example, the conductor pattern is formed from etching of a metallic foil, metallic plating, etc.

The above insulating layer is constructed from a synthetic resin simple substance, a resin basic material constructed by synthetic resin and an inorganic filler, a cloth basic material constructed by synthetic resin and an inorganic cloth, a prepreg, etc. The above synthetic resin is constructed by epoxy resin, phenol resin, polyimide resin, polybutadiene resin, fluoride resin, etc.

The third invention can be utilized in a multilayer printed wiring board requiring high connection reliability such as a memory module, a multichip module, a mother board, a daughter board, a plastic package, etc.

An external connecting terminal is preferably joined to a surface of the above pad for external connection in a central position of the hole for conductivity. In this case, the external connecting terminal can be stably joined to the surface of the pad for external connection.

The above external connecting terminal is preferably constructed by a soldering ball, a probe, conductive paste or a conductive wire. This is because these external connecting terminals can exactly input and output electric information transmitted to the pad for external connection.

When the printed wiring board of the above third invention is manufactured, there is a manufacturing method of a printed wiring board in which a conductor pattern is formed on an upper face of an insulating layer and a pad for external connection is formed on a lower face of the insulating layer, and said conductor pattern and the pad for external connection are electrically connected to each other by a hole for conductivity; the manufacturing method being characterized by an upper face copper foil and a lower face copper foil which are first respectively stuck to the upper and lower faces of the insulating layer; an opening hole is next formed by removing a portion corresponding to a forming portion of the hole for conductivity in said upper face copper foil by etching; the hole for conductivity is next formed in the insulating layer exposed from the opening hole of said upper face copper foil, and a bottom portion of the hole for conductivity is set to reach said lower face copper foil; a chemical plating film is next formed in an inner wall of the hole for conductivity; an electric plating film for continuously covering the inner wall and the bottom portion of the hole for conductivity is next formed within the hole for conductivity; a conductor pattern electrically connected to said hole for conductivity is next formed from the upper face copper foil from etching said upper face copper foil and the lower face copper foil, and a pad for external connection for closing an opening portion of said hole for conductivity is formed from said lower face copper foil.

In this manufacturing method, it is most noticeable that the pad for external connection is formed from etching the lower face copper foil constituting the bottom portion of the hole for conductivity after the hole for conductivity is formed and the inner wall and the bottom portion of the hole for conductivity are covered with the metallic plating film.

After the bottom portion of the hole for conductivity is formed in order to reach the lower face copper foil, the electric plating film for continuously covering the inner wall and the bottom portion of the hole for conductivity is formed in the hole for conductivity. The electric plating film is closely attached to the lower face copper foil as the bottom portion of the hole for conductivity. Therefore, the pad for external connection can be securely closely attached to the electric plating film within the hole for conductivity even when the pad for external connection is reduced to a size approximately similar to that of the hole for conductivity from etching the lower face copper foil.

Therefore, a surplus area is formed on the lower face of the insulating layer by reducing the size of the pad for external connection. Another pad for external connection, a conductive layer, etc. can be further mounted to this surplus area at high density.

For example, there is a method for irradiating a laser beam to the forming portion of the hole for conductivity in the insulating layer as a method for forming the hole for conductivity in the above insulating layer.

The laser beam sequentially bores a hole within the insulating layer by giving high energy to the insulating layer. The laser beam is reflected on the lower face copper foil when an end tip of the laser beam reaches the lower face copper foil. Therefore, when the irradiation of the laser beam is stopped here, a non-through hole for conductivity having one opening portion covered with the lower face copper foil is formed.

It is noticeable here that the non-through hole reaching the lower face copper foil canbe formedby irradiating the laser beam. Conventionally it is necessary that a hole is bored in the insulating layer by a drill and a router and an opening portion of this hole is then covered with a copper foil to form such a non-through hole. However, the non-through hole reaching the lower face copper foil can be formed by irradiating the laser beam so that no covering work of the opening portion is required after the boring. Therefore, the number of manufacturing processes is reduced and manufacturing cost can be reduced.

The conductor pattern formed on the upper surface of the insulating layer, and the pad for external connection formed on the lower face of the insulating layer can be simultaneously formed by etching the upper face copper foil and the lower face copper foil. Accordingly, the printed wiring board can be manufactured efficiently and easily.

After the above conductor pattern and the pad for external connection are formed, one, two or more other insulating layers are preferably laminated with the above insulating layer having the pad for external connection in a state in which the above pad for external connection is arranged in an outermost layer. In this case, high density mounting of the printed wiring board be obtained.

An external connecting terminal is preferably joined to a surface of the above pad for external connection in a central position of the hole for conductivity. In this case, similar to the above-mentioned invention of claim 2, the external connecting terminal can be joined to the pad for external connection in a stable state.

A fourth invention is a manufacturing method of a printed wiring board having a conductor pattern covered with an electric plating film on the surface of an insulating substrate; the manufacturing method being characterized in that the manufacturing method comprises a process for forming the conductor pattern on the surface of the insulating substrate and forming a plating lead electrically connected to the conductor pattern; a process for covering a surface of the conductor pattern with the electric plating film by flowing an electric current to the conductor pattern through said plating lead; and a process for melting and cutting the plating lead by irradiating a laser beam to said plating lead.

In the fourth invention, it is most noticeable that the plating lead is melted and cut by the laser beam after the electric plating film is formed on the surface of the conductor pattern by using the plating lead.

An operation and effects of the fourth invention will be explained.

Coherent light having aligned phases is obtained by the laser beam so that directivity is good. Therefore, high energy can be given to a very small portion by irradiating the laser beam. Hence, only the plating lead can be melted and cut without damaging the conductor pattern arranged around the plating lead even when the plating lead is finely constructed. Accordingly, the plating lead can be formed in a very small pattern so that the distance between conductor patterns can be reduced to 0.3 mm at its minimum. Accordingly, high density mounting of the conductor patterns can be realized in accordance with the present invention.

The above laser beam is preferably constructed by using an excimer laser, a carbon dioxide gas laser, etc.

The laser beam preferably has energy intensity set such that the plating lead is sufficiently melted and cut and no insulating substrate below the plating lead is damaged. For example, such energy intensity is set such that a wavelength ranges from 20 nm to 10 μm and an output ranges from 30 to 300 W and an irradiating time ranges from 0.1 to 1.0 second.

A melting and cutting state of the plating lead using the laser beam is adjusted by the energy intensity of the laser beam, the irradiating time, etc.

The above electric plating film can be formed by a general electric plating method. For example, the electric plating film can be formed by depositing a metal on the surface of the conductor pattern by flowing an electric current to the conductor pattern through the plating lead in a state in which the insulating substrate is dipped into an electric plating reservoir.

For example, the above conductor pattern is all conductive patterns able to be formed on the surface of the insulating substrate such as a wiring circuit, a pad, a terminal, a land, etc. For example, the conductor pattern is formed by etching of a metallic foil, metallic plating, etc.

The above insulating substrate is constructed by a synthetic resin simple substance, a resin basic material constructed by synthetic resin and an inorganic filler, a cloth basic material constructed by synthetic resin and an inorganic cloth, etc. The above synthetic resin is constructed by epoxy resin, phenol resin, polyimide resin, polybutadiene resin, fluoride resin, etc. These insulating substrates can be laminated with other insulating substrates by interposing an adhesive such as a prepreg, etc. so that a multilayer printed wiring board can be constructed.

There is a manufacturing method of the printed wiring board for forming the electric plating film in an inner wall of the through hole in addition to the surface of the conductor pattern by utilizing the above fourth invention. This manufacturing method is a manufacturing method of a printed wiring board in which the printed wiring board has a conductor pattern formed on the surface of an insulating substrate and also has a through hole extending through said insulating substrate, and a surface of said conductor pattern and an inner wall of the through hole are covered with an electric plating film; the manufacturing method being characterized in that the manufacturing method comprises a process for boring the through hole in the insulating substrate; a process for forming a chemical plating film in the inner wall of said through hole; a process for forming the conductor pattern on the surface of said insulating substrate, and forming a plating lead for electrically connecting the conductor pattern and said chemical plating film within the through hole; a process for covering surfaces of the conductor pattern and said chemical plating film with the electric plating film by flowing an electric current to the conductor pattern and said chemical plating film through said plating lead; and a process for melting and cutting the plating lead by irradiating a laser beam to said plating lead.

When the electric plating film is formed in the inner wall of the through hole, the chemical plating film is formed by the chemical plating method in this inner wall after the through hole is bored. Thus, conductivity is given to the inner wall of the through hole. An electric current is flowed to the chemical plating film covering the inner wall of the through hole through the plating lead in a state in which the insulating substrate is dipped into an electric plating reservoir. Thus, a metal is deposited on the surface of the chemical plating film so that the electric plating film is formed.

Similar to the above fourth invention, the plating lead connected to the through hole and the conductor pattern is also melted and cut by irradiating the laser beam in this manufacturing method after the electric plating film is formed. Therefore, the plating lead can be set to a very small portion so that both of distances between through holes and between the conductor patterns can be reduced to about 0.3 mm at its minimum. Accordingly, high density mounting of the through holes and the conductor patterns can be realized.

The above through hole is a through hole extending through the insulating substrate, or a non-through hole not extending through the insulating substrate.

The above chemical plating film can be formed by the general chemical plating method.

Further, similar to the above case, the electric plating film can be formed on the surface of the conductor pattern by the general electric plating method.

The above laser beam can be constructed by using an excimer laser, a carbon dioxide gas laser, etc.

The process for forming the above conductor pattern and the plating lead may be performed before or after the boring process of the through hole. Otherwise, the process for forming the above conductor pattern and the plating lead may be also performed before or after the forming process of the above chemical plating film.

The printed wiring board of the fourth invention can be utilized in a multilayer printed wiring board requiring high connection reliability such as a memory module, a multichip module, a mother board, a daughter board, a plastic package, etc.

BRIEF DESCRIPTION OF THE DRAWINGS

FIG. 1(a) is a cross-sectional view of an insulating substrate covered with an insulating film in an embodiment mode example 1, and FIG. 1(b) is a cross-sectional view of the insulating substrate showing a method for forming an opening portion in the insulating film.

FIG. 2 is a cross-sectional view of the insulating substrate in which a plating film is formed on the surface of a conductor circuit in the embodiment mode example 1.

FIG. 3(a) is a cross-sectional view of the insulating substrate for showing an opening portion opened in the same shape approximately as the conductor circuit in the embodiment mode example 1, and FIG. 3(b) is a cross-sectional view of the insulating substrate for showing an opening portion opened until a peripheral edge of the conductor circuit.

FIG. 8 is a cross-sectional view of a printed wiring board in an embodiment mode example 4.

FIG. 9 is a cross-sectional view of a main portion of the printed wiring board in the embodiment mode example 4.

EXPLANATION OF THE REFERENCE NUMERALS

Figure 4:
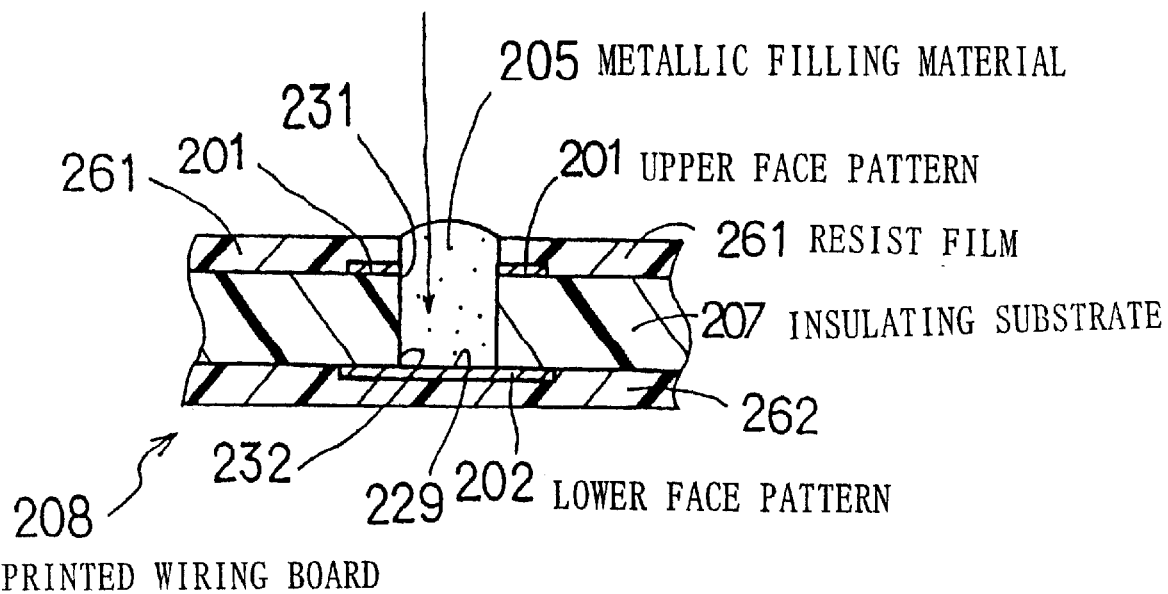
FIG. 4 is a cross-sectional view of a printed wiring board in an embodiment mode example 2.

101 - - - insulating film,
110 - - - opening portion,
102 - - - laser beam,
106 - - - conductor circuit,
107 - - - insulating substrate,
201 - - - upper face pattern,
202 - - - lower face pattern,
203 - - - hole for conductivity,
205 - - - metallic filling material,
261, 262 - - - resist film,
207 - - - insulating substrate,
208 - - - printed wiring board,
301 - - - pad for external connection,
310 - - - external connecting terminal,
321 - - - upper face copper foil,
322 - - - lower face copper foil,
323 - - - metallic plating film,
325, 326 - - - conductor pattern,
327 - - - bonding pad,
331, 332 - - - hole for conductivity,
341, 342 - - - printed wiring board,
305 - - - insulating substrate,
351, 352 - - - insulating layer,
306 - - - solder resist,
307 - - - electronic part,
370 - - - mounting portion,
308 - - - partner member,
401 - - - conductor pattern,
402 - - - plating lead,
403 - - - printed wiring board,
404 - - - electric current,
405 - - - through hole,
406 - - - mounting portion,
407 - - - insulating substrate,
408 - - - laser beam.

BEST MODES FOR EMBODYING THE INVENTION

EMOBODIMENT MODE EXAMPLE 1

A manufacturing method of a printed wiring board in an embodiment mode example of a first invention will be explained by using FIGS. 1 to 3.

A summary of this manufacturing method will first be explained. That is, a solder resist constructed by thermosetting resin is printed on the surface of an insulating substrate 107 having a conductor circuit 106 and including a surface of this conductor circuit 106. The solder resist is thermally cured so that an insulating film 101 having a low coefficient of thermal expansion is formed (FIG. 1(a)). Next, a laser beam 102 is irradiated to an opening portion forming portion in the insulating film 101 and this opening portion forming portion is burnt out, and an opening portion 110 is formed and one portion of the conductor circuit 106 is exposed (FIG. 1(b)).

A manufacturing method of the above printed wiring board will next be explained in detail.

First, a copper foil having 18 μm in thickness is stuck to an insulating substrate constructed by resin including glass epoxy. Next, a hole for mounting electronic parts (see FIG. 28) is bored into the insulating substrate 107. Next, as shown in FIG. 1(a), the copper foil is etched and a conductor circuit 106 is formed on a surface of the insulating substrate 107.

Next, a solder resist constructed by thermosetting resin is printed on the entire surface of the insulating substrate 107.

Epoxy-including resin impregnated with a filler is used as the thermosetting resin. The printed solder resist has 40 μm in thickness.

Next, the insulating substrate 107 is put into a heating furnace and the solder resist is thermally cured and set to an insulating film 101 (FIG. 1(a)). This insulating film 101 has a low coefficient thermal expansion of 50 ppm/° C.

Next, a laser beam 102 is irradiated to an opening portion forming portion in the insulating film 101 and this opening portion forming portion is burnt out. As shown in FIG. 1(b), an opening portion 110 is thus formed in the insulating film 101. The laser is constructed by using a general $CO_2$ laser.

Thus, a conductor circuit 106 is exposed from the opening portion 110.

Next, desmear processing is performed with respect to the conductor circuit 106 by using a drug in which permanganate or bichromate is dissolved into a strong acid such as concentrated sulfuric acid, etc.

Next, as shown in FIG. 2, a Ni—Au plating film 131 is formed by an electric plating method on a surface of the exposed conductor circuit 106. Next, an Au plating film 132 is formed on a surface of the Ni—Au plating film 131 by the electric plating method.

Figure 28:
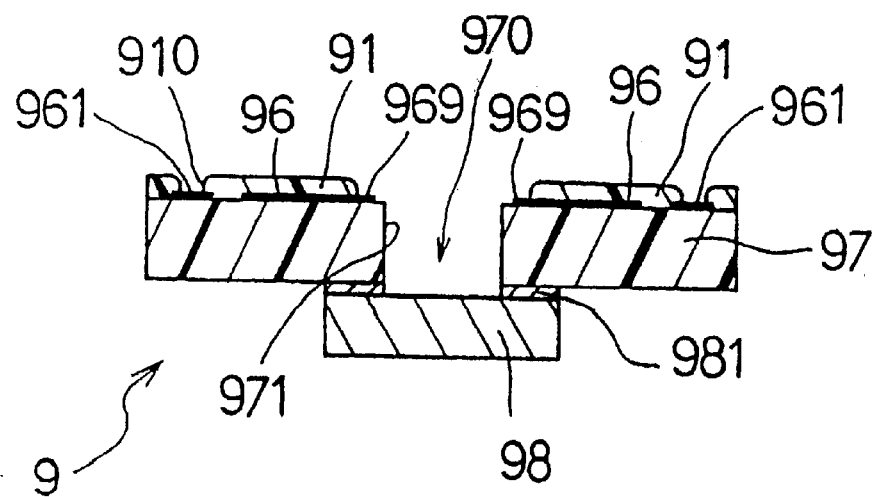
FIG. 28 is a cross-sectional view of a printed wiring board in a conventional example.
Figure 29:
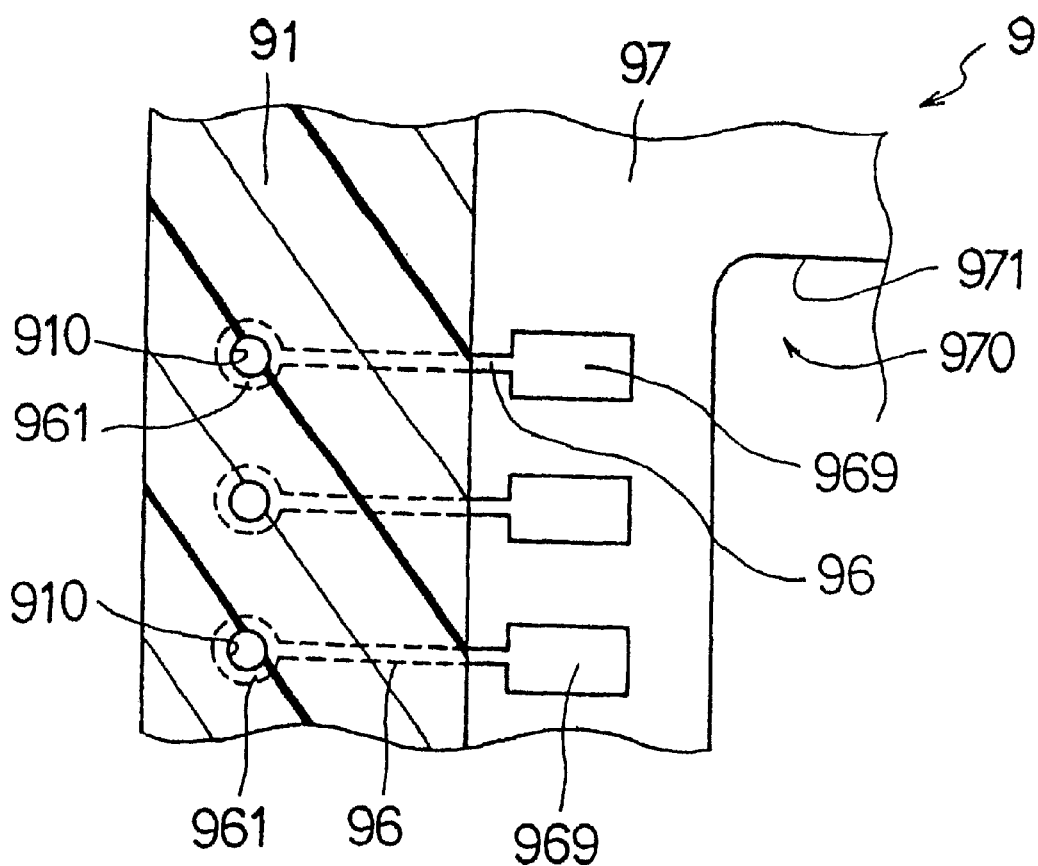
FIG. 29 is a partial plan view of the printed wiring board in the conventional example.
Figure 30:
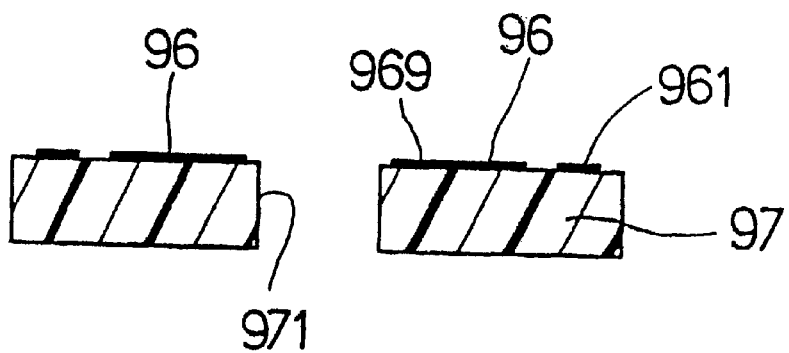
FIG. 30 is a cross-sectional view of an insulating substrate forming a conductor circuit therein in the conventional example.
Figure 31:
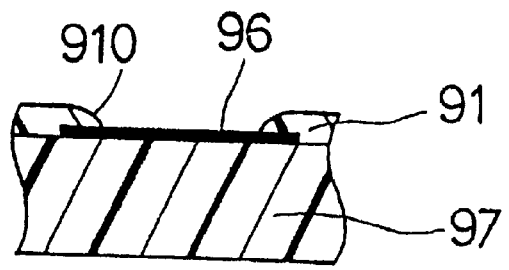
FIG. 31 is a cross-sectional view of the insulating substrate in which a solder resist is printed in the conventional example.
Figure 32:
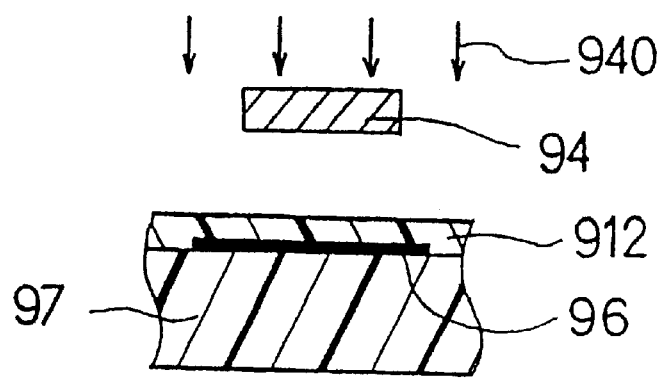
FIG. 32 is a cross-sectional view of an insulating substrate showing a method for forming an opening portion in an insulating film in another conventional example.
Figure 33:
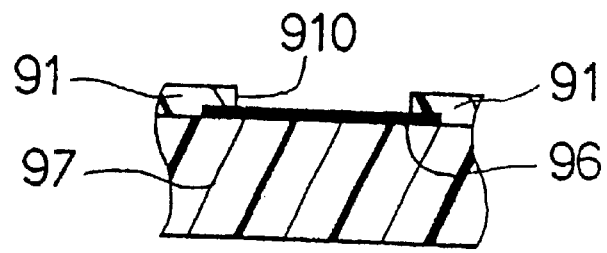
FIG. 33 is a cross-sectional view of the insulating substrate forming the opening portion in the insulating film in another conventional example.

Thereafter, a heat radiating plate is adhered to a surface of the insulating substrate 107 by using an adhesive so that a printed wiring board is obtained (see FIG. 28).

As shown in FIG. 1(b), the opening portion 110 formed by irradiating the laser beam may be constructed such that only one portion of an upper face of the conductor circuit 106 is exposed. However, as shown in FIG. 3, the opening portion 110 may also be constructed such that one portion (FIG. 3(a)) of the upper face and a side face of the conductor circuit 106, or the conductor circuit 106 and the insulating substrate 107 at a peripheral edge of this conductor circuit 106 are exposed.

An operation and effects of this example will next be explained.

In this example, as shown in FIG. 1(b), the entire surface of the insulating substrate 107 is covered with the insulating film 101 and the laser beam 102 is irradiated to a portion for forming the opening portion. High energy is given by the laser beam 102 to the irradiating portion of the laser beam 102 so that the irradiating portion has a very high temperature and is burnt out. Therefore, a very small opening portion 110 can be formed in the insulating film 101.

Further, no light is scattered since the irradiated laser beam is parallel light. Therefore, a very small opening portion having about 0. 05 to 0.60 mm in size can be formed in a desirable position and size.

Accordingly, many opening portions can be formed in a small space and high density mounting can be obtained.

The insulating film 101 is constructed by thermosetting epoxy resin. Therefore, as shown in FIG. 1(b), no insulating film 101 is separated from the insulating substrate 107 at a peripheral edge 108 of the opening portion 110 by the desmear processing.

EMBODIMENT MODE EXAMPLE 2

A printed wiring board in an embodiment mode example of a second invention will be explained by using FIGS. 4 to 7.

As shown in FIG. 4, the printed wiring board 208 in this example has an upper face pattern 201 formed on an upper face of an insulating substrate 207, a lower face pattern 202 formed on a lower face of the insulating substrate 207, and a hole 203 for conductivity extending through the insulating substrate 207 and reaching an upper face 228 of the lower face pattern 202. A metallic filling material 205 is arranged within the hole 203 for conductivity and is filled with solder for electrically conducting the upper face pattern 201 and the lower face pattern 202. The upper face pattern 201 is covered with a resist film 261 except for a peripheral portion of the hole 203 for conductivity.

Figure 5:
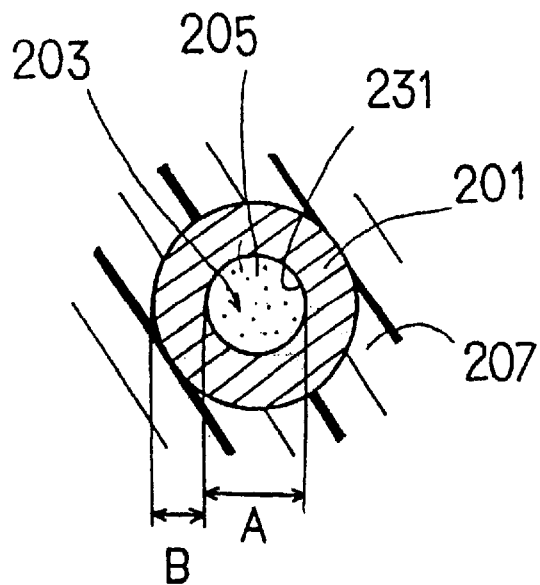
FIG. 5 is an explanatory view showing a peripheral portion of an upper end of a hole for conductivity in the embodiment mode example 2.

The insulating substrate is set to have 0.1 mm in thickness. As shown in FIG. 5, the hole 203 for conductivity has a diameter A of 0.3 mm. An upper end portion 231 of the hole 203 for conductivity is surrounded by the upper face pattern 201 having 0.025 mm in width B. In contrast to this, a lower end portion 232 of the hole 203 for conductivity is covered with the lower face pattern 202 so as to cover a bottom portion of the lower end portion 232.

A mounting portion for mounting electronic parts is formed in a central portion of the printed wiring board 208 (omitted in the drawings).

A manufacturing method of the above printed wiring board will next be explained.

Figure 6:
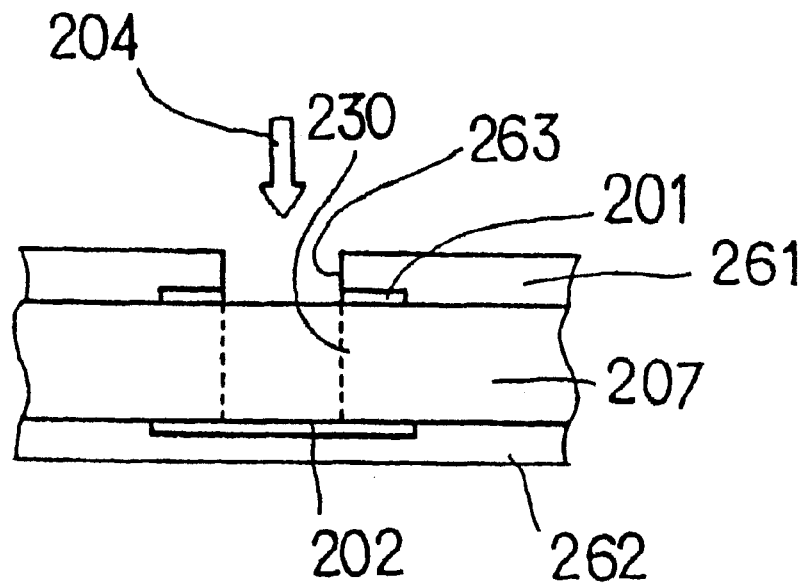
FIG. 6 is an explanatory view showing a forming method of the hole for conductivity in the embodiment mode example 2.

First, an insulating substrate constructed by glass epoxy resin is prepared. A copper foil is stuck to upper and lower faces of the insulating substrate. Next, an unnecessary portion of the copper foil is etched and removed from the copper foil. Thus, as shown in FIG. 6, an upper face pattern 201 and a lower face pattern 202 are formed. The upper face pattern 201 is formed around a forming portion 230 of a hole for conductivity on an upper face of the insulating substrate 207. The lower face pattern 202 is formed on a lower face of the insulating substrate 207 in order to cover the forming portion 230 of the hole for conductivity.

Next, the upper face of the insulating substrate 207 is covered with a resist film 261. The resist film 261 formed on this upper face forms an opening hole 263 for opening the insulating substrate 207 in the forming portion 230 of the hole for conductivity.

Further, the lower face of the insulating substrate 207 is covered with a resist film 262. The resist film 262 formed on this lower face covers the lower face of the insulating substrate 207 including the forming portion 230 of the hole for conductivity.

Figure 7:
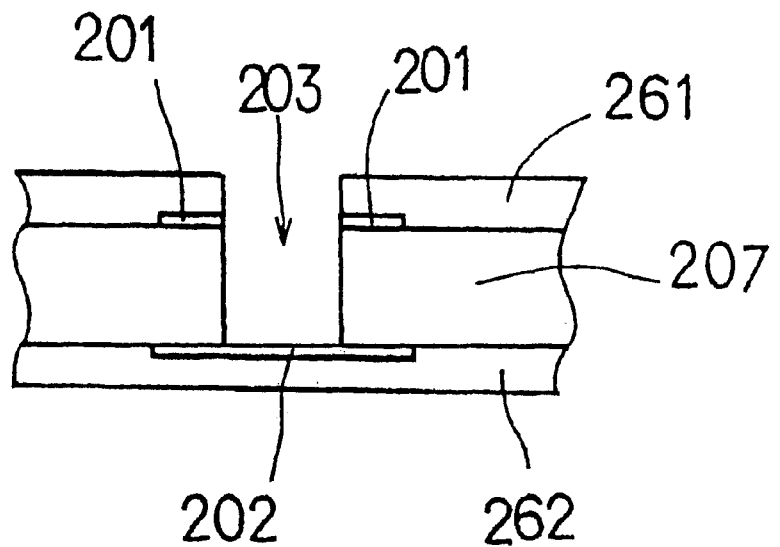
FIG. 7 is an explanatory view of the insulating substrate forming the hole for conductivity therein in the embodiment mode example 2.

Next, a laser beam 204 is irradiated to the forming portion 230 of the hole for conductivity. A carbon dioxide gas laser is used as a laser of the laser beam 204. Thus, as shown in FIG. 7, a hole 203 for conductivity extending through the insulating substrate 207 in the forming portion 230 of the hole for conductivity and reaching an upper face of the lower face pattern 202 is formed in a state in which the lower face pattern 202 is left.

Next, an electric plating method of flowing electricity to the lower face pattern 202 is executed in a state in which the insulating substrate 207 is dipped into a solder plating reservoir. Thus, as shown in FIG. 4, solder is deposited from the upper face of the lower face pattern 202 within the hole 203 for conductivity, and fills the entire interior of the hole 203 for conductivity so that a metallic filling material 205 is formed.

Thus, the above printed wiring board 208 is obtained.

An operation and effects of this example will next be explained.

As shown in FIG. 4, the hole 203 for conductivity is formed so as to extend through the insulating substrate 207 and the metallic filling material 205 is formed within the hole 203 for conductivity. A lower end portion 232 of the hole 203 for conductivity is covered with the lower face pattern 202. In contrast to this, the upper face pattern 201 is formed around an upper end portion 31 of the hole 203 for conductivity. Therefore, the upper face pattern 201 and the lower face pattern 202 can be electrically conducted to each other through the metallic filling material 205 within the hole 203 for conductivity.

Further, the metallic filling material 205 formed within the hole 203 for conductivity is joined to the upper face pattern 201 on a side face of an upper end portion 231 of this metallic filling material 205. Therefore, the upper face pattern 201 can be joined to the metallic filling material 205 irrespective of the large or small value width of the upper face pattern 201 so that the upper face pattern 201 and the metallic filling material 205 can reliably be electrically conducted to each other. Accordingly, as in the conventional case it is not necessary that the width of a plating attaching area for forming a plating film in the hole 203 for conductivity is formed in the upper face pattern 201.

In accordance with this example, the width of the upper face pattern 201 formed around the hole 203 for conductivity can be narrowed in comparison with the conventional case. Further, a surplus area is formed on a surface of the insulating substrate 207 by a narrowed amount of the width of the upper face pattern 201. Accordingly, another upper face pattern, an electronic part mounting portion, etc. can be further formed in this surplus area so that high density mounting can be achieved.

EMBODIMENT MODE EXAMPLE 3

This example is an embodiment mode example of the second invention. This example differs from the embodiment mode example 2 in that the interior of the hole for conductivity is filled with a metal by a printing method.

Specifically, similar to the above embodiment mode example 2, after the hole for conductivity is formed, a mask for printing having an opening hole in a portion corresponding to the hole for conductivity is arranged on an upper face side of the insulating substrate. Next, soldering paste is arranged on the mask and is pressed by a roller. Thus, the soldering paste is moved from the opening hole of the mask into the hole for conductivity. Accordingly, the interior of the hole for conductivity is filled with the solder so that a metallic filling material is formed.

The others are similar to those in the embodiment mode example 2.

In this example, effects similar to those in the embodiment mode example 2 can be also obtained.

EMBODIMENT MODE EXAMPLE 4

A printed wiring board in accordance with an embodiment mode example of a third invention will next be explained by using FIGS. 8 to 16.

As shown in FIG. 8, the printed wiring board 341 in this example has an insulating substrate 305 constructed by two insulating layers 351, 352, a pad 301 for external connection arranged in an outermost layer of the insulating substrate 305, conductor patterns 325, 326 arranged in another layer different from the outermost layer, and holes 331, 332 for conductivity, electrically connecting the pad 301 for external connection and the conductor patterns 325, 326.

As shown in FIG. 9, the pad 301 for external connection closes an opening portion 339 on an outermost layer side of the hole 331 for conductivity and forms a bottom portion of the hole 331 for conductivity. An inner wall and the bottom portion of the hole 331 for conductivity are covered with a metallic plating film 323.

Figure 15:
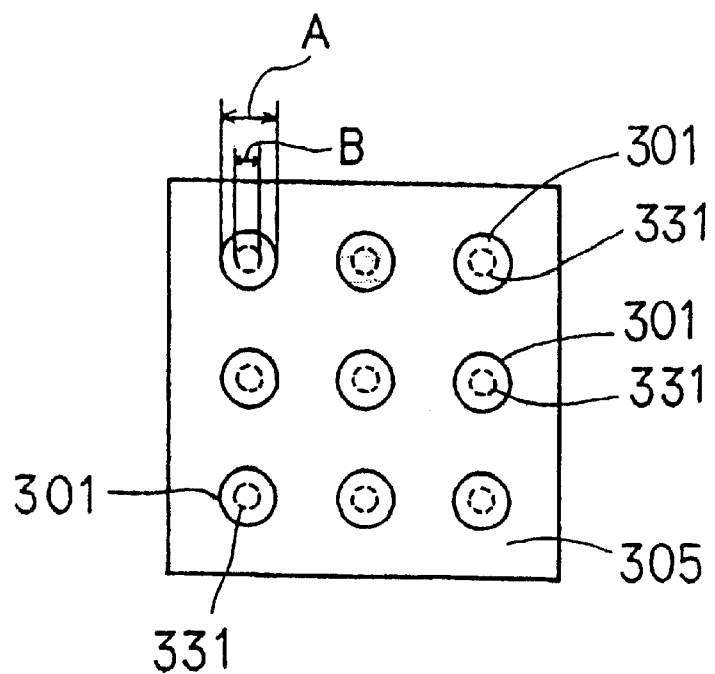
FIG. 15 is a rear explanatory view of the insulating substrate showing an arranging position of the pad for external connection in the embodiment mode example 4.

As shown in FIG. 15, an external connecting terminal 310 is joined to a surface of the pad 301 for external connection in a central position of the hole 331 for conductivity. The external connecting terminal 310 is a soldering ball for joining the printed wiring board 341 to a partner member 308 such as a mother board, etc.

The pad 301 for external connection has a diameter A from 0.2 to 0.4 mm. An opening diameter B of the hole 331 for conductivity is approximately equal to a diameter from 0.1 to 0.3 mm.

In the insulating substrate 305, a mounting portion 370 for mounting an electronic part 307 is formed in an outermost layer on a side opposed to an arranging side of the pad 301 for external connection. The mounting portion 370 is arranged approximately on the entire surface of a lower portion of the electronic part 370. The electronic part 307 is adhered to the mounting portion 370 by an adhesive 372 such as silver paste, etc. Many bonding pads 327 for joining the bonding wire 371 are arranged around the mounting portion 370.

Surfaces of the respective insulating layers 351, 352 are covered with a solder resist 306. Inner walls and bottom portions of the holes 331, 332 for conductivity are covered with the metallic plating film 323. One portion of the solder resist 306 enters the interiors of the holes 331, 332 for conductivity.

A manufacturing method of the above printed wiring board will next be explained.

Figure 10:
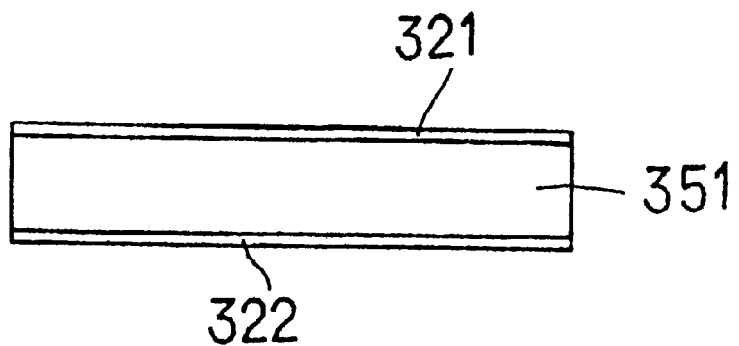
FIG. 10 is an explanatory view for showing a manufacturing method of the printed wiring board in the embodiment mode example 4 and an insulating layer sticking a copper foil thereto.

First, an insulating layer constructed by a glass epoxy substrate is prepared. Next, as shown in FIG. 10, an upper face copper foil 321 and a lower face copper foil 322 are respectively stuck to upper and lower faces of the insulating layer 351.

Figure 11:
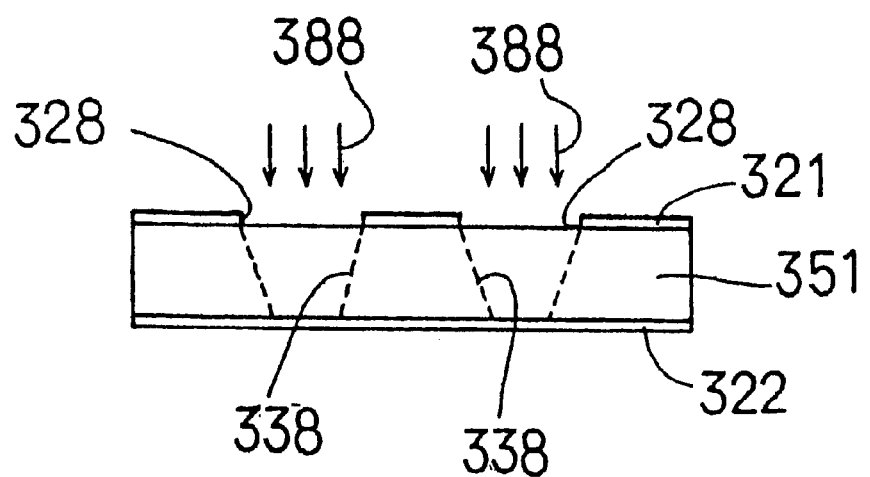
FIG. 11 is an explanatory view of the insulating layer continued from FIG. 10 and showing a forming method of a hole for conductivity.

Next, as shown in FIG. 11, a portion of the upper face copper foil 321 corresponding to a forming portion 338 of a hole for conductivity is removed from the upper face copper foil 321 by etching so that an opening hole 328 is formed.

Figure 12:
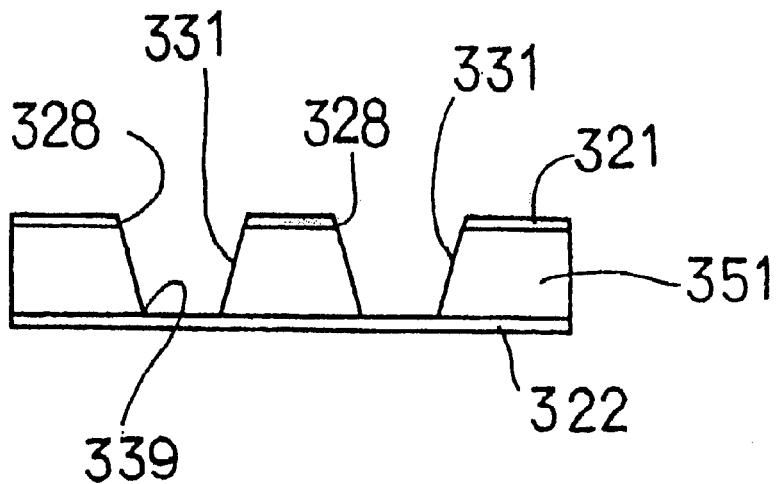
FIG. 12 is an explanatory view continued from FIG. 11 and showing the insulating layer forming the hole for conductivity therein.

Next, a laser beam 388 is irradiated to the forming portion 338 of the hole for conductivity from above the upper face copper foil 321. Thus, as shown in FIG. 12, the hole 331 for conductivity is formed in the insulating layer 351 exposed from the opening hole 328 of the upper face copper foil 321, and a bottom portion of the hole 331 for conductivity is set to reach the lower face copper foil 322.

Figure 13:
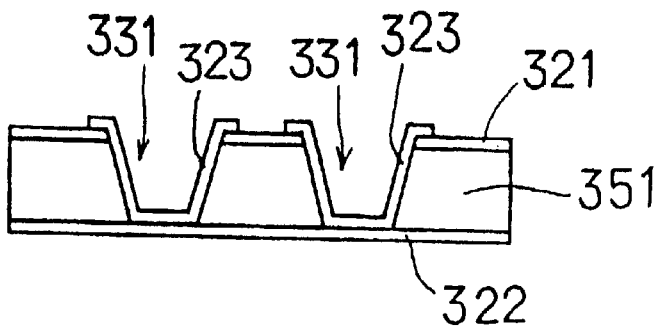
FIG. 13 is an explanatory view continued from FIG. 12 and showing the insulating layer in which a metallic plating film is formed within the hole for conductivity.

Next, as shown in FIG. 13, a metallic plating film 323 is formed in an inner wall and the bottom portion of the hole 331 for conductivity by a chemical plating method and an electric plating method.

As shown in FIG. 9, this metallic plating film 323 is also formed on a surface of the lower face copper foil 322.

Figure 14:
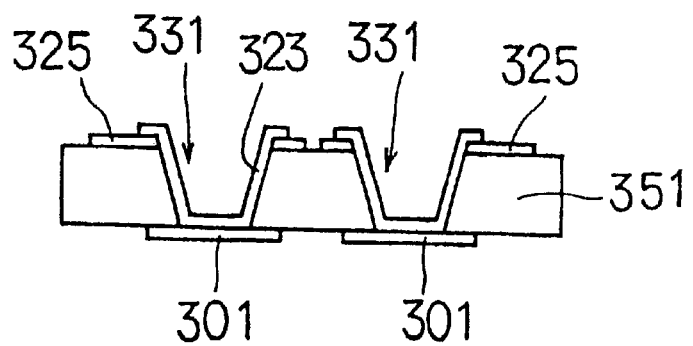
FIG. 14 is an explanatory view continued from FIG. 13 showing the insulating layer in which a conductor pattern and a pad for external connection are formed.

Next, the upper face copper foil 321 and the lower face copper foil 322 are etched and a conductor pattern 325 electrically connected to the hole 331 for conductivity is formed from the upper face copper foil 321 as shown in FIG. 14. Further, a pad 301 for external connection for closing an opening portion of the hole 331 for conductivity is formed from the lower face copper foil 322.

Next, as shown in FIG. 9, a surface of the insulating layer 351 is covered with a solder resist 306 and one portion of the solder resist 306 enters the interior of the hole 331 for conductivity and fills this interior.

Next, as shown in FIG. 8, another insulating layer 352 is laminated with an upper face of the insulating layer 351 so that an insulating substrate 305 is obtained. Specifically, a prepreg and a copper foil are laminated and press-attached to the upper face of the insulating layer 351. Next, the copper foil is etched so that a conductor pattern 326, a bonding pad 327 and a mounting portion 370 are formed. Next, a laser beam is irradiated to the insulating layer 352 so that a hole 332 for conductivity is formed. At this time, a bottom portion of the hole 332 for conductivity is set to reach the internal conductor pattern 325. Next, a metallic plating film 323 is formed in an inner wall and the bottom portion of the hole 332 for conductivity by the chemical plating method and the electric plating method.

Next, a surface of the insulating layer 352 is covered with a solder resist 306, and one portion of the solder resist 306 enters the interior of the hole 332 for conductivity and fills this hole. At this time, the bonding pad 327 is exposed as it is.

Thus, a printed wiring board 341 is obtained.

An operation and effects of the printed wiring board in this example will next be explained.

As shown in FIG. 8, the pad 301 for external connection is arranged so as to form a bottom portion of the hole 331 for conductivity. Therefore, it is unnecessary to form a conductor pattern for connecting the hole 331 for conductivity and the pad 301 for external connection. Accordingly, a surplus area is formed on a surface of the insulating substrate 305 and another conductor pattern, etc. can be arranged in this surplus area so that high density surface mounting can be realized. Further, as shown in FIG. 15, the distance between the respective holes 331 for conductivity can be reduced so that the holes 331 for conductivity can be arranged at high density in comparison with the conventional holes for conductivity.

As shown in FIG. 9, the pad 301 for external connection closes an opening portion of the hole 331 for conductivity on its outermost layer side and forms the bottom portion of the hole 331 for conductivity. Therefore, the pad 301 for external connection has at least an area of the opening portion of the hole 331 for conductivity. Hence, the pad 301 for external connection can secure a sufficient joining area for joining an external connecting terminal 310 and has an excellent joining strength to the external connecting terminal 310.

Further, a metallic plating film 323 for continuously covering an inner wall and a bottom portion of the hole 331 for conductivity is formed within the hole 331 for conductivity. Therefore, the pad 301 as the bottom portion for external connection is strongly joined to the metallic plating film 323 so that joining strength to the hole 331 for conductivity is improved. Hence, the pad 301 for external connection can be reduced to a size close to that of the opening portion of the hole 331 for conductivity. Accordingly, it is possible to obtain high density mounting of the pad 301 for external connection and increase density of surface mounting of the insulating substrate 305.

In the manufacturing method of the above printed wiring board, as shown in FIGS. 13 and 14, after the metallic plating film 323 is formed in the inner wall and the bottom portion of the hole 331 for conductivity, the pad 301 for external connection is formed by etching the lower face copper foil 322.

Therefore, the lower face copper foil 322 is closely attached strongly to the metallic plating film 323 in the bottom portion of the hole 331 for conductivity. Accordingly, the pad 301 for external connection can be reduced to a size approximately equal to that of the hole 331 for conductivity so that high density mounting can be obtained.

As shown in FIG. 11, a laser beam 388 is irradiated to a forming portion 338 of the hole for conductivity in an insulating layer 351. At this time, the laser beam 388 gives high energy to the insulating layer 351 so that a hole is sequentially bored within the insulating layer 351. When an end tip of the laser beam 388 reaches the lower face copper foil 322, the laser beam 388 is reflected on the lower face copper foil 322. Therefore, when the irradiation of the laser beam 388 is stopped here, a non-through hole 331 for conductivity is formed as shown in FIG. 12. In this non-through hole 331 for conductivity, one opening portion 339 is covered with the lower face copper foil 322 and no hole 331 extends through the lower face copper foil 322.

It is here noticeable that the non-through hole can be formed by irradiating the laser beam 388. It is conventionally necessary that a hole is bored by a drill in the insulating layer and an opening portion of this hole is then covered with a copper foil to form such a non-through hole. However, the non-through hole reaching the lower face copper foil 322 can be formed by irradiating the laser beam so that no covering work of the opening portion is required after the boring. Therefore, the number of manufacturing processes is reduced and manufacturing cost can be reduced.

The laser beam is also used when the hole 332 for conductivity is formed in another insulating layer 352. Therefore, it is possible to easily form the hole 332 for conductivity in which the bottom portion of the hole 332 for conductivity reaches the internal conductor pattern 325.

The conductor pattern 325 formed on an upper face of the insulating layer 351 and the pad 301 for external connection formed on a lower face of the insulating layer 351 can be simultaneously formed by etching the upper face copper foil 321 and the lower face copper foil 322. Therefore, the printed wiring board 341 can be manufactured easily and efficiently.

Figure 16:
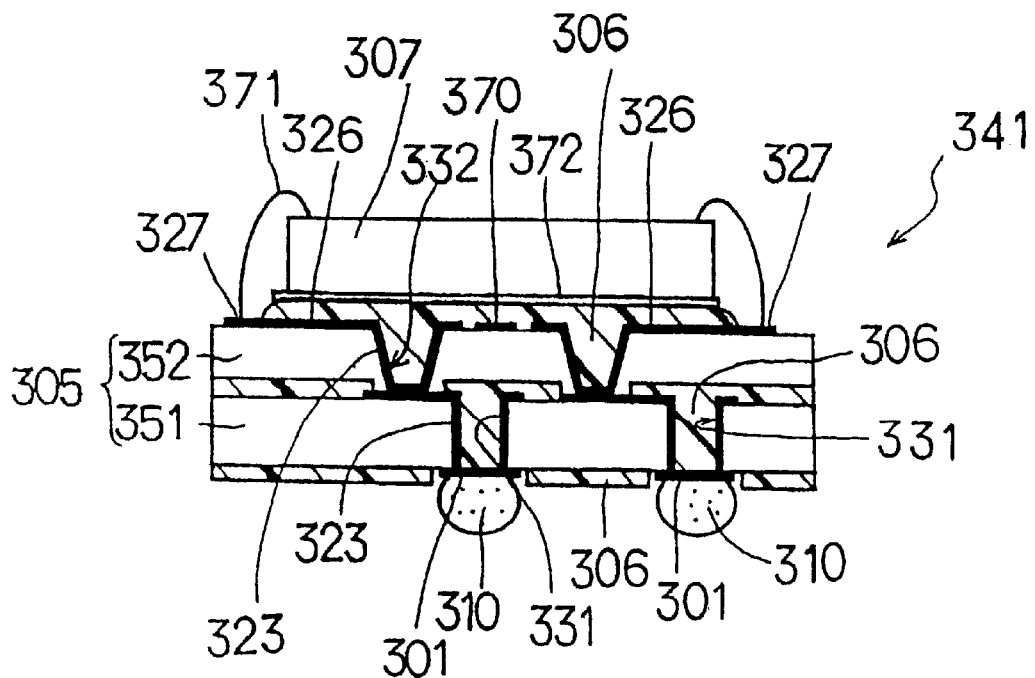
FIG. 16 is a cross-sectional view of the printed wiring board used as a chip size package in the embodiment mode example 4.

As mentioned above, it is possible to cope with the high density mounting of the hole 331 for conductivity and the pad 301 for external connection. Therefore, as shown in FIG. 16, the conductor pattern 326 connected to the bonding pad 327 is led around the interior of the mounting portion 370 so that a chip size package having approximately the same size as the electronic part 307 can be obtained. In this case, it is necessary to secure an insulating property with respect to the mounting portion 370 in the conductor pattern 326 led into the mounting portion 370. The mounting portion 370 is arranged approximately on the entire face of a lower portion of the electronic part 307 in a leading-in state of the conductor pattern 326.

EMBODIMENT MODE EXAMPLE 5

Figure 17:
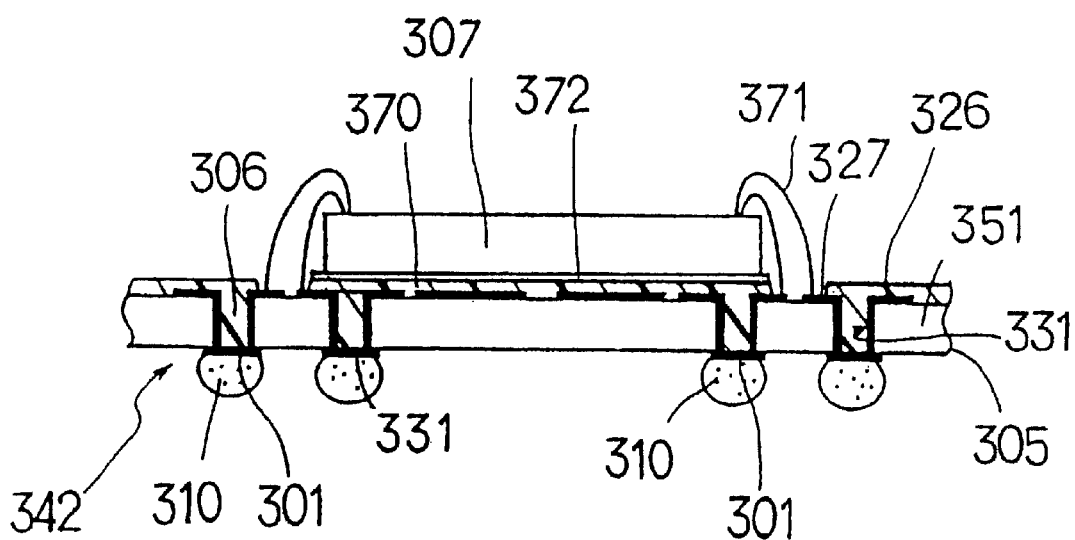
FIG. 17 is a cross-sectional view of a printed wiring board in an embodiment mode example 5.

This example is an embodiment mode example of the third invention. In a printed wiring board 342 in this example, the insulating substrate 305 is constructed by a single insulating layer 351 as shown in FIG. 17.

A surface of the insulating layer 351 forms an outermost layer of the insulating substrate 305. An electronic part 307 is mounted onto one side of the insulating layer 351 and a soldering ball 310 is joined to the other side of the insulating layer 351.

The other constructions are similar to those in the embodiment mode example 4.

Effects similar to those in the embodiment mode example 4 can be also obtained in this example.

EMBODIMENT MODE EXAMPLE 6

A manufacturing method of a printed wiring board in an embodiment mode example of a fourth invention will be explained by using FIGS. 18 to 27.

Figure 18:
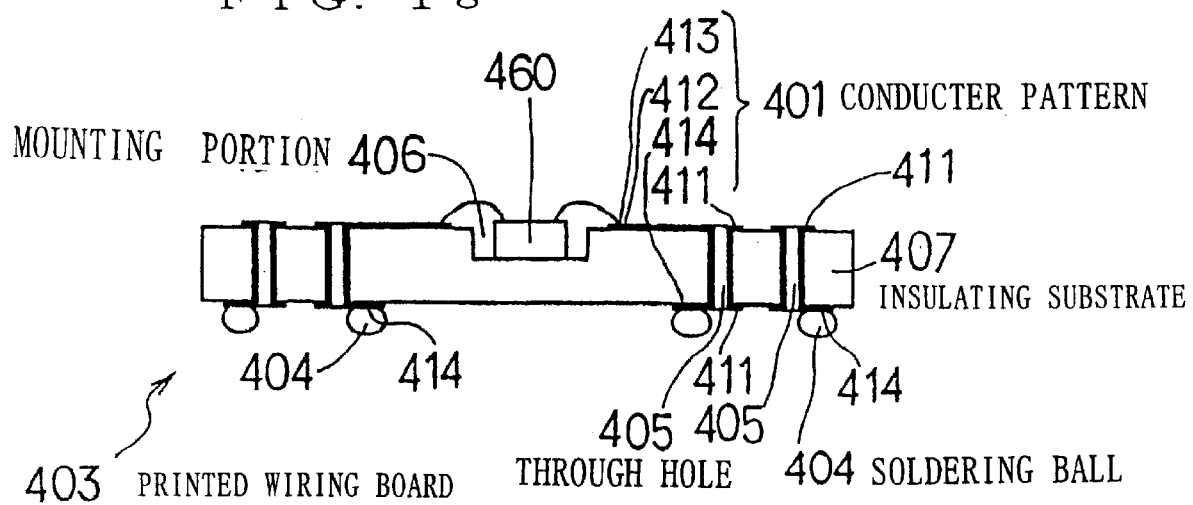
FIG. 18 is a cross-sectional view of a printed wiring board in an embodiment mode example 6.
Figure 19:
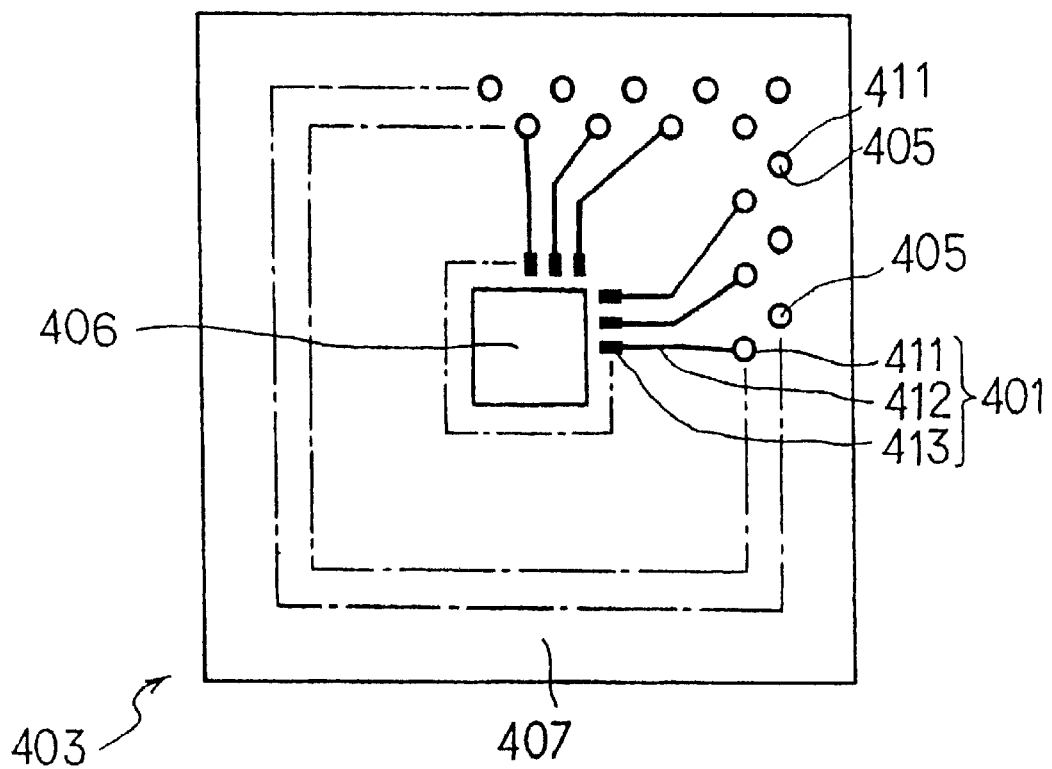
FIG. 19 is a plan view of the printed wiring board in the embodiment mode example 6.
Figure 20:
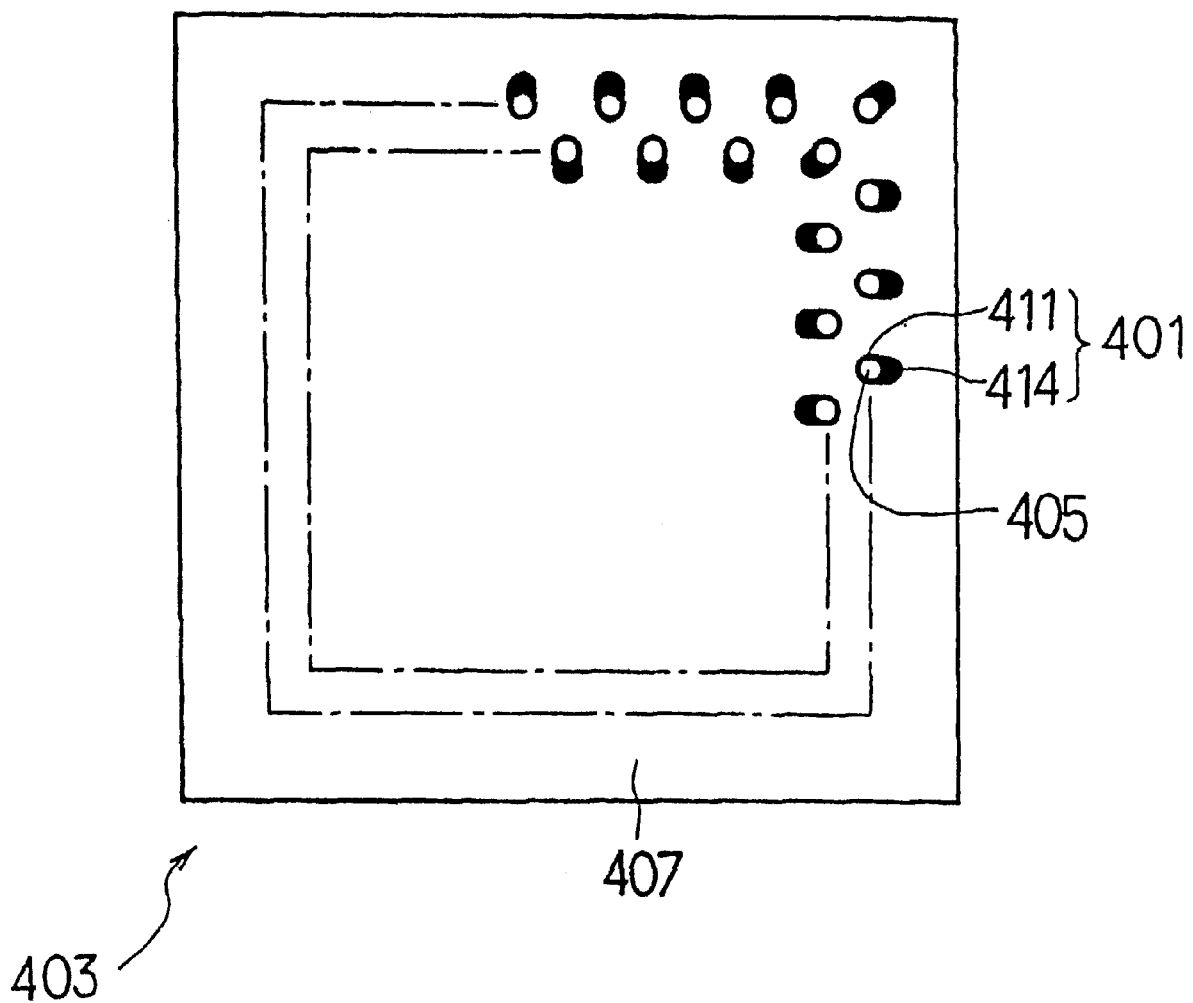
FIG. 20 is a rear view of the printed wiring board in the embodiment mode example 6.

As shown in FIGS. 18 to 20, the printed wiring board 403 manufactured in this example has a mounting portion 406 for mounting electronic parts and a conductor pattern 401 on the surface of an insulating substrate 407. Further, a through hole 405 for performing electric conduction between upper and lower portions of the printed wiring board is formed.

The conductor pattern 401 is constructed by a land 411 of the through hole 405, a terminal 413 for joining a bonding wire 461 connected to an electronic part 60, a wiring circuit 412 for electrically connecting the land 411 and the terminal 413 to each other, and a pad 414 for joining a soldering ball 4.

Many through holes 405 are formed in a peripheral portion of the insulating substrate 407.

The manufacturing method of the printed wiring board in this example will be explained next.

Figure 21:
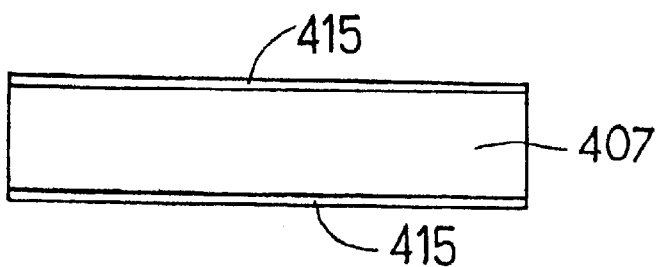
FIG. 21 is a sectional explanatory view of an insulating substrate sticking a copper foil thereto in a manufacturing method of the printed wiring board in the embodiment mode example 6.
Figure 22:
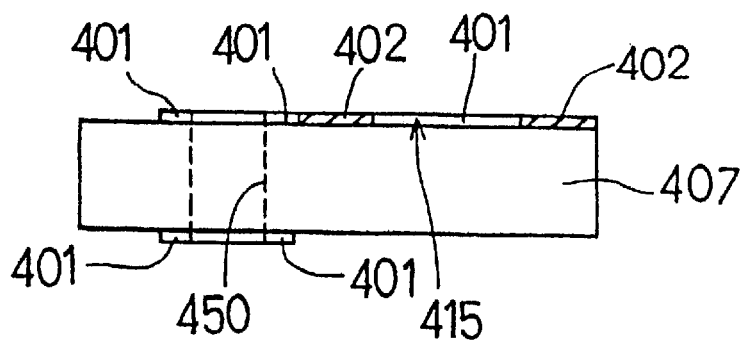
FIG. 22 is a sectional explanatory view continued from FIG. 21 showing the insulating substrate in which a conductor pattern and a plating lead are formed.

First, as shown in FIG. 21, an insulating substrate 407 constructed by a glass epoxy substrate is prepared, and a copper foil 415 is stuck to both faces of the insulating substrate 407. Next, as shown in FIG. 22, an unnecessary portion of the copper foil 415 is removed therefrom by etching and a conductor pattern 401 is formed. Further, a plating lead 402 for electrically connecting each conductor pattern 401 is formed. A minimum clearance of the conductor patterns 401 interposing the plating lead 402 is set to 0.3 mm therebetween.

Figure 23:
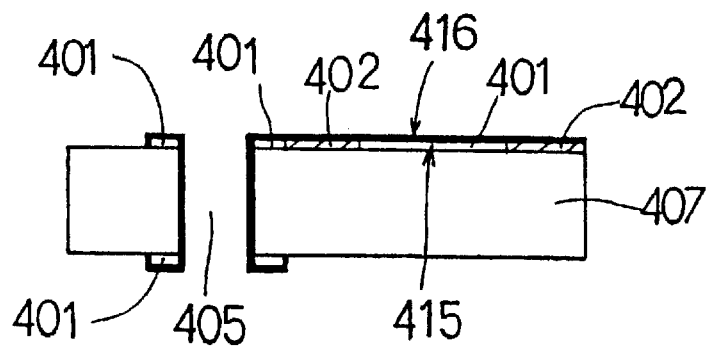
FIG. 23 is a sectional explanatory view continued from FIG. 22 showing the insulating substrate in which a through hole and a chemical plating film are formed.

Next, as shown in FIG. 23, a through hole forming portion 450 of the insulating substrate 407 is bored by using a drill, a router, etc. so that a through hole 405 is bored.

Figure 24:
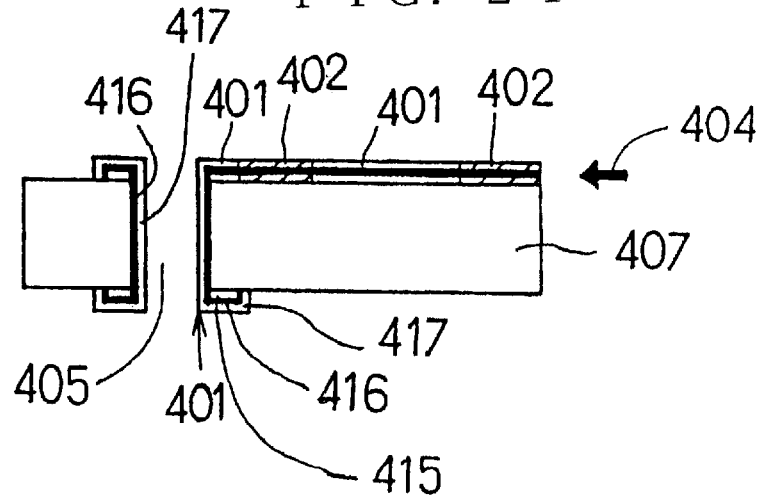
FIG. 24 is a sectional explanatory view continued from FIG. 23 showing the insulating substrate forming an electric plating film therein.
Figure 25:
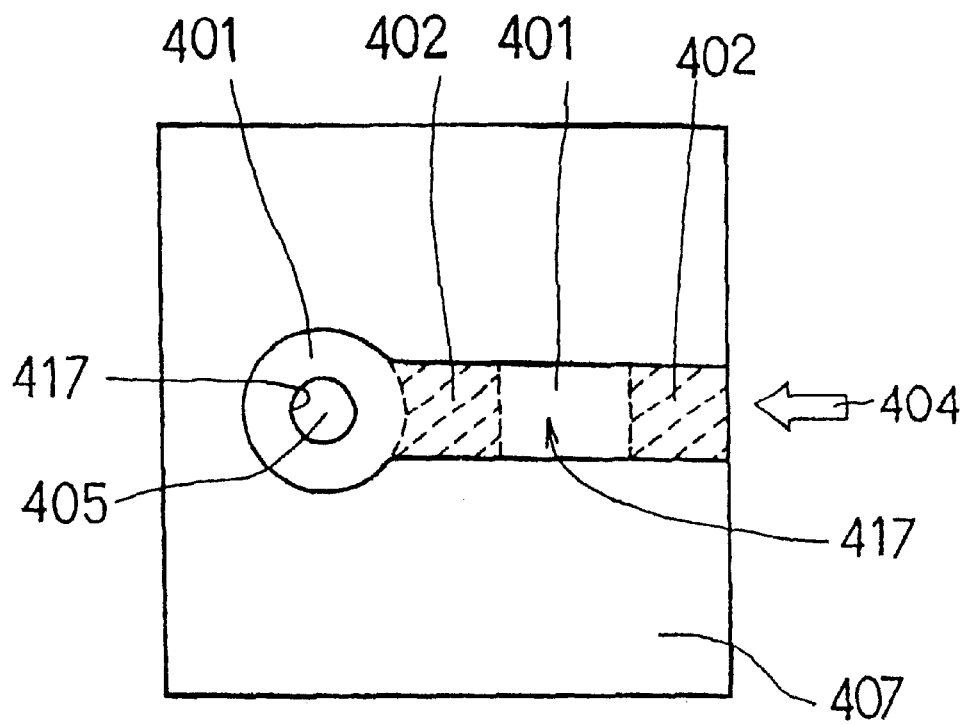
FIG. 25 is a plan explanatory view continued from FIG. 23 showing the insulating substrate forming the electric plating film therein.

Next, a chemical plating film 416 is formed on a surface of the conductor pattern 401 and is also formed in an inner wall of the through hole 405. The chemical plating film 461 is made of copper and has 2 µm in thickness. Next, as shown in FIGS. 24 and 25, an electric current 404 flows to the conductor pattern 401 and the chemical plating film 416 through the plating lead 402 in a state in which the insulating substrate 407 is dipped into an electric plating reservoir. Thus, surfaces of the conductor pattern 401 and the chemical plating film 416 are covered with an electric plating film 417. The electric plating film 417 is made of copper and has 10 µm in thickness.

Figure 26:
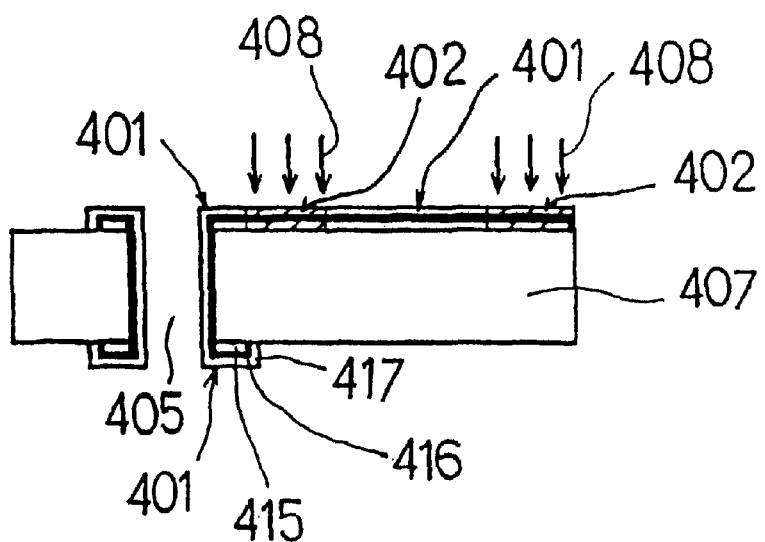
FIG. 26 is a sectional explanatory view continued from FIG. 25 showing a melting and cutting method of the plating lead.
Figure 27:
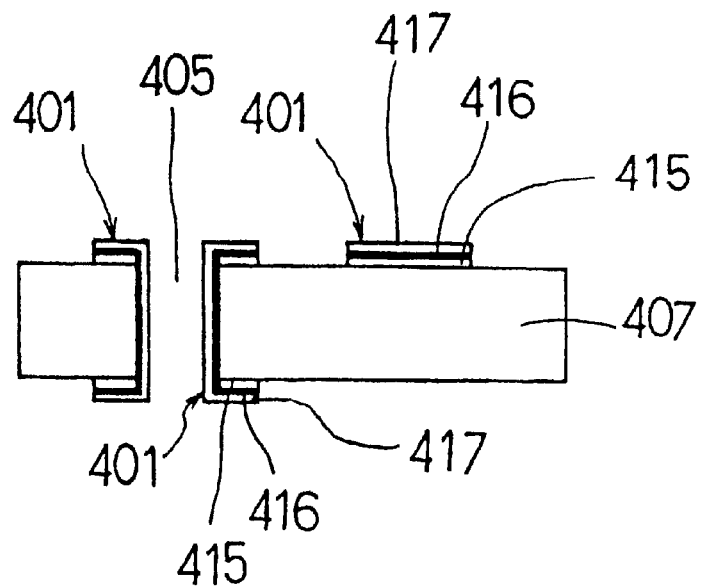
FIG. 27 is a sectional explanatory view continued from FIG. 26 showing the insulating substrate removing the plating lead therefrom.

Next, as shown in FIG. 26, a laser beam 408 is irradiated to the plating lead 402 so that the plating lead 402 is melted and cut. The laser beam 408 is irradiated by using an excimer laser having 248 nm in wavelength and 50 W in output. Thus, as shown in FIG. 27, the conductor patterns 401 are insulated from each other.

Thus, a printed wiring board 403 shown in FIGS. 18 to 20 is obtained.

An operation and effects of this example will next be explained.

The laser beam is coherent light having aligned phases in order that directivity is high. Accordingly, as shown in FIG. 26, high energy can be given to a very small portion by irradiating the laser beam 408. Therefore, only the plating lead 402 can be melted and cut without damaging the conductor pattern 401 even when the plating lead 402 is finely constructed. Accordingly, the plating lead 402 can be formed in a very small pattern so that the distance between conductor patterns 401 and the distance between through holes 405 can be reduced. Accordingly, high density mounting of the conductor patterns 401 can be realized in accordance with this example. Industrial applicability As mentioned above, in accordance with the present invention, it is possible to provide a printed wiring board capable of forming an insulating film having a very small opening portion and a manufacturing method of the printed wiring board.

What is claimed is:

1. A printed wiring board having an insulating substrate constructed by one, two or more insulating layers, a pad for external connection arranged in an outermost layer of the insulating substrate, a conductor pattern arranged in another layer different from said outermost layer, and a hole for conductivity for electrically connecting said pad for external connection and said conductor pattern;

the printed wiring board being characterized in that said pad for external connection closes an opening portion of the hole for conductivity on its outermost layer side and forms a bottom portion of the hole for conductivity;

a metal film covering a surface of an external connection side of said pad;

a metallic plating film for continuously covering an inner wall and the bottom portion of the hole for conductivity is formed within said hole for conductivity; and a thermosetting resin at least partially filling an inside portion of said metallic plating film.

2. The printed wiring board as claimed in claim 1, wherein an external connecting terminal is joined to a surface of said pad for external connection in a central position of said hole for conductivity.

3. The printed wiring board as claimed in claim 1, wherein an external connecting terminal is one of a soldering ball, a probe, a conductive adhesive, and a conductive wire.

4. The printed wiring board as claimed in claim 1 including:

a surplus area formed on a surface of the insulating substrate; and another conductor pattern formed on the surplus area so that high density surface mounting can be obtained.

* * * * *